United States Patent
Ramet

(10) Patent No.: US 8,305,153 B2
(45) Date of Patent: Nov. 6, 2012

(54) CRYSTAL OSCILLATOR WITH FAST START-UP AND LOW CURRENT CONSUMPTION

(75) Inventor: Serge Ramet, Jarrie (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 12/975,782

(22) Filed: Dec. 22, 2010

(65) Prior Publication Data

US 2011/0148533 A1 Jun. 23, 2011

(30) Foreign Application Priority Data

Dec. 22, 2009 (FR) .................................... 09 06234

(51) Int. Cl.
*H03B 5/32* (2006.01)

(52) U.S. Cl. ................ 331/158; 331/108 R; 331/182; 331/183

(58) Field of Classification Search ............ 331/107 R, 331/108 R, 116 R, 116 FE, 154, 158, 182, 331/183
See application file for complete search history.

(56) References Cited

U.S. PATENT DOCUMENTS

| | | | | |
|---|---|---|---|---|
| 5,805,027 A * | 9/1998 | Yin | ......................... | 331/116 FE |
| 6,194,973 B1 | 2/2001 | Williamson | .................. | 331/109 |
| 6,278,338 B1 * | 8/2001 | Jansson | .................... | 331/116 FE |
| 7,123,109 B2 * | 10/2006 | Stevenson et al. | ............ | 331/109 |
| 7,262,671 B2 | 8/2007 | Maeder | ......................... | 331/183 |
| 7,696,834 B2 * | 4/2010 | Sung | .............................. | 331/109 |
| 7,852,164 B2 * | 12/2010 | Ishikawa | .................. | 331/116 R |
| 2008/0100390 A1 | 5/2008 | Novac | ............................ | 331/116 |
| 2009/0066434 A1 * | 3/2009 | Isberg | ........................... | 331/183 |

OTHER PUBLICATIONS

Nonaka et al. "*The Current Dependence of Crystal Unit Resistance At Low Drive Level*", 25th Annual Symposium on Frequency Control, 1971, pp. 139-1477, 1971.

* cited by examiner

*Primary Examiner* — Joseph Chang
*Assistant Examiner* — Jeffrey Shin
(74) *Attorney, Agent, or Firm* — Allen, Dyer, Doppelt, Milbrath & Gilchrist, P.A.

(57) ABSTRACT

An oscillator comprises an inverter, with a resonator connected between an input and an output of the inverter. A transistor external to the inverter is connected in a current mirror mode with a transistor of the inverter so that the inverter's transistor copies the current of the external transistor. The external transistor has its drain terminal connected to the gate terminals of the inverter's transistor and of the external transistor. A current source is connected to the gate terminal of the inverter's transistor, and a switch is connected between the drain and gate terminals of the external transistor. Circuitry controls the switch so as to open the connection between the drain and gate terminals of the external transistor at the beginning of a start-up phase of the oscillator.

13 Claims, 2 Drawing Sheets

CRYSTAL OSCILLATOR WITH FAST START-UP AND LOW CURRENT CONSUMPTION

FIELD OF THE INVENTION

The invention relates to crystal oscillators, and, in particular, to fast start-up oscillators.

BACKGROUND OF THE INVENTION

FIG. 1 represents a basic diagram of a crystal oscillator. A crystal resonator 10 is connected between the input and the output of an inverter 12 formed by two complementary transistors. The output of the oscillator is taken at the output of the inverter.

The common mode of the inverter is fixed by a resistor 14 connected between the inverter's input and output. A frequency correction network comprising two capacitors 16 and 17, respectively connecting the resonator terminals to a reference voltage, enables adjustment of the oscillator's frequency.

FIG. 2 is a schematic plot representing the variations in time upon start-up of the oscillation frequency of an oscillator of the type of FIG. 1. From time t=0, the frequency increases progressively to asymptotically reach a nominal value.

As can be observed, the oscillator may not be immediately operational. Two conditions for use of the oscillator from start-up can often be distinguished. A time t1 defines conditions from which a microcontroller may be synchronized for certain start-up tasks not requiring great frequency accuracy. The frequency accuracy at time t1 is for example –1%. At a time t2, the oscillator should reach its maximum accuracy, for example 10 ppm.

A desire to use a microcontroller as of time t1 exists in the field of low-power applications where an apparatus regularly wakes up from a standby state to check whether there is a task to be performed. If there is no task to be performed, the apparatus switches back to standby state. It is therefore desirable for time t1 to be reached rapidly after start-up and for the power consumption necessary to reach this time to be minimum. It is desirable, for example, that time t1 be less than 800 μs.

Time t2, from which maximum accuracy of the oscillator is reached, is for example 4.5 ms. It may be desirable for the oscillator to consume a minimum power from this time on, in steady state, while guaranteeing the same accuracy.

It is however usual that the minimum current for keeping the oscillator in its steady state is insufficient for the oscillator to start-up fast enough to reach a time t1 within the times that are currently required (800 μs).

It is established that the oscillator start-up speed increases with the supply current. It is therefore useful to supply the oscillator with a high current at start-up for it to start quicker, and to then reduce the current in steady state to reduce power consumption.

Oscillator structures exist where inverter 12 is replaced by a variable gain current amplifier to regulate the gain inversely to the oscillation amplitude. The purpose of such a structure is mainly to help ensure that the oscillation amplitude in steady state does not clip, in order to prevent phenomena detrimental to the operation of the oscillator and the circuitry it supplies. In such a structure, the oscillator happens to be supplied with a higher current on start-up than in steady state.

Such an oscillator is described for example in U.S. Pat. No. 7,262,671. It comprises a transistor external to the inverter, connected in current mirror mode with the P transistor of the inverter, so that the inverter's transistor copies the external transistor's current. This external transistor has its drain terminal connected to the gate terminals of both the inverter's transistor and the external transistor. A current source biases the external transistor with a fixed current on which a regulation circuit superposes a variable current which is a reverse function of the oscillation amplitude.

The regulation has a linear range and is optimized to help prevent clipping in steady state. The characteristics of this regulation depend on the sizing of the transistors and are therefore likely to vary with temperature and with uncontrollable variations of the manufacturing process. Furthermore, the regulation is not intended for optimizing the start-up speed and the current consumption in steady state. On account of the fact that the circuit comprises branches with four transistors in series between the power supply terminals, it is not suitable for use under low supply voltages.

SUMMARY OF THE INVENTION

There is therefore a need for a crystal oscillator that can start-up quickly while having a low steady state power consumption. It is further desirable for the oscillator not to be sensitive to temperature and process variations.

To contribute to satisfying this need, the oscillator is started by supplying it with a start-up current until the end of a latency phase without oscillations, which is inherent to the use of a crystal resonator. The oscillator is then supplied with a lower current than the start-up current from a time between the end of the latency phase and establishment of a steady state.

An oscillator structure is also provided, comprising an inverter and a resonator connected between the input and output of the inverter. A transistor external to the inverter is connected in current mirror mode with a transistor of the inverter so that the inverter's transistor copies the external transistor's current. The external transistor has its drain terminal connected to the gate terminals of the inverter's transistor and of the external transistor. A current source is connected to the gate terminal of the inverter transistor, and a switch is connected for interrupting the current in the external transistor at the beginning of a start-up phase of the oscillator.

BRIEF DESCRIPTION OF THE DRAWINGS

Other advantages and features will become more clearly apparent from the following description of exemplary non-restrictive embodiments of the invention, illustrated by the accompanying drawings, in which.

DETAILED DESCRIPTION OF THE PREFERRED EMBODIMENTS

Figure 1:
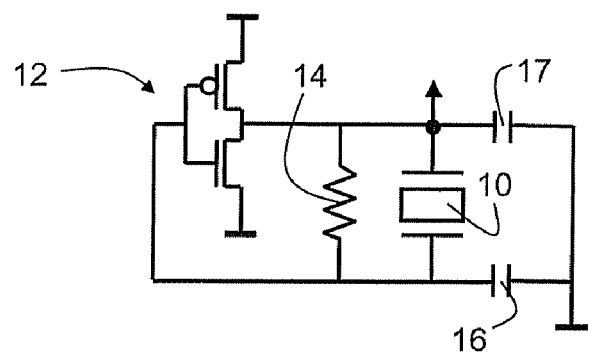
FIG. 1, previously described, is a generic diagram of a crystal resonator oscillator, according to the prior art.
Figure 2:
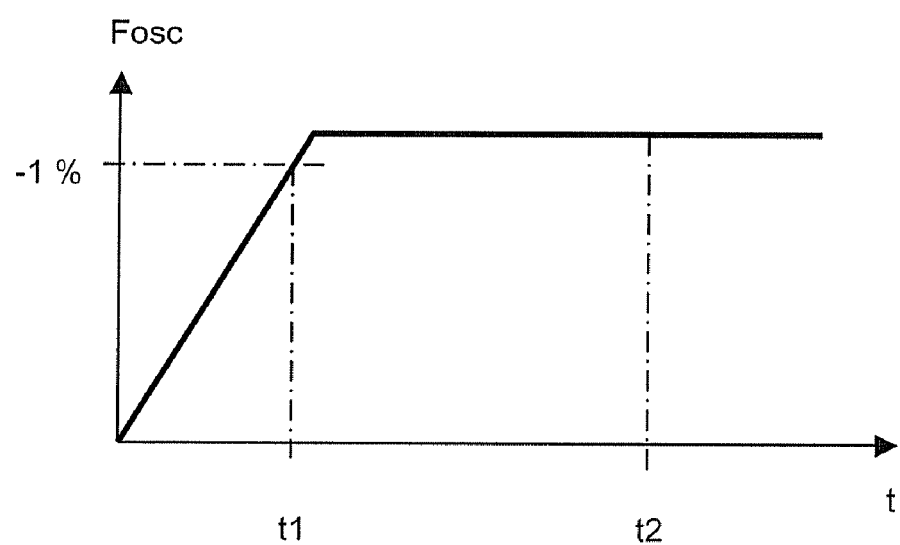
FIG. 2, previously described, represents a variation of the oscillation frequency on start-up of such an oscillator, according to the prior art.
Figure 3:
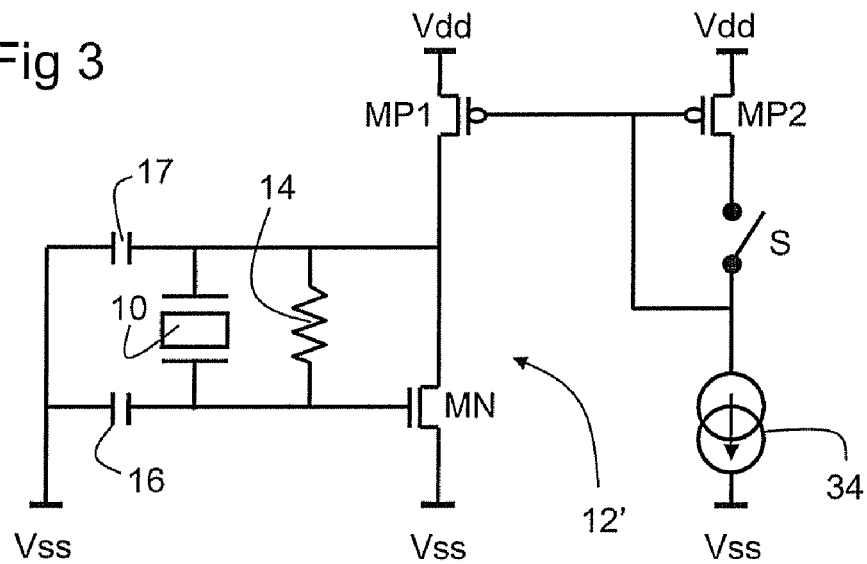
FIG. 3 represents a generic diagram of an embodiment of a crystal oscillator optimized with respect to its start-up speed and power consumption, according to the present invention.

In FIG. 3, in an embodiment of an optimized crystal oscillator, same elements as in FIG. 1 are designated by same reference numbers, in particular crystal resonator 10 associated with its frequency compensation components (capacitors 16, 17) and inverter biasing components (resistor 14).

The inverter, designated here by reference 12', is of different structure than in FIG. 1. It comprises an N-channel MOS transistor MN having its source connected to a low supply rail Vss, its gate connected to a first terminal of resonator 10, and its drain connected to the second terminal of resonator 10. A P-channel MOS transistor MP1 has its drain connected to the drain of transistor MN and its source connected to a high supply rail Vdd. The gate of transistor MP1, instead of being connected to the gate of transistor MN as in a conventional inverter configuration (FIG. 1), is connected to line Vss through a current source 34.

A P-channel MOS transistor MP2 is connected in parallel via its gate and source to transistor MP1. The drain and gate of transistor MP2 are connected to one another by a switch S. In steady state, switch S is closed. It can be observed that transistor MP2 is then connected as a diode and that transistor MP1 is coupled in a current mirror arrangement with transistor MP2 so as to copy the current set in transistor MP2 by current source 34, with a multiplication factor corresponding to the size ratio of transistors MP1 and MP2.

In this configuration, inverter 12' has an active load structure (formed by transistor MP1 acting as constant current source), instead of having a complementary transistor structure (FIG. 1). The current of transistor MP1 is preferably set to the minimum used to maintain oscillation in steady state, for example 300 μA.

On start-up, switch S is open. Transistor MP2 is no longer connected as a diode and current source 34 pulls the gate of transistor MP1 to low supply rail Vss. Transistor MP1 is fully turned-on and behaves as a low-impedance resistive load. Inverter 12' therefore operates with a high current promoting the oscillation start-up. The size of transistor MP1 determines the maximum current desired for start-up.

Switch S is thus controlled to be initially open and then closed when the oscillator reaches its steady state. The function of switch S is to interrupt the current in transistor MP2, so that the current from source 34 is directed to the gate of transistor MP1. Other configurations of this switch are possible. The switch may, for instance, be placed between the source of transistor MP2 and supply rail Vdd.

It is preferred to reduce the time during which the maximum start-up current is consumed. It is thus sought to close switch S well before steady state is established without penalizing the start-up speed.

The use of a high current proves not to be useful over the whole start-up phase. It is sufficient for the current to be high during an initial latency phase where the oscillation amplitude remains zero. This latency phenomenon was revealed for example in the article "The current dependence of crystal unit resistance at low drive level", Shunsuke NONAKA, Tasuku YUUKI, Koich HARA, Nippon Electric Company, Transmission Division, Shimonumabe, Kawasaki, Japan. A crystal resonator is in fact subjected to mechanical friction that opposes its oscillation and that is overcome in order to establish oscillation. This friction is overcome by providing an energy exceeding a threshold. Once the energy threshold is reached, oscillation starts and the value of the current then has less influence on the remaining start-up phase.

Thus, according to an advantageous alternative, on start-up of the oscillator, switch S, initially open to impose a high start-up current, is closed as soon as the occurrence of oscillations is detected.

In practice, since it is difficult to detect the beginning of an oscillation, it is preferred to provide progressive switching triggered by the beginning of oscillation.

Figure 4:
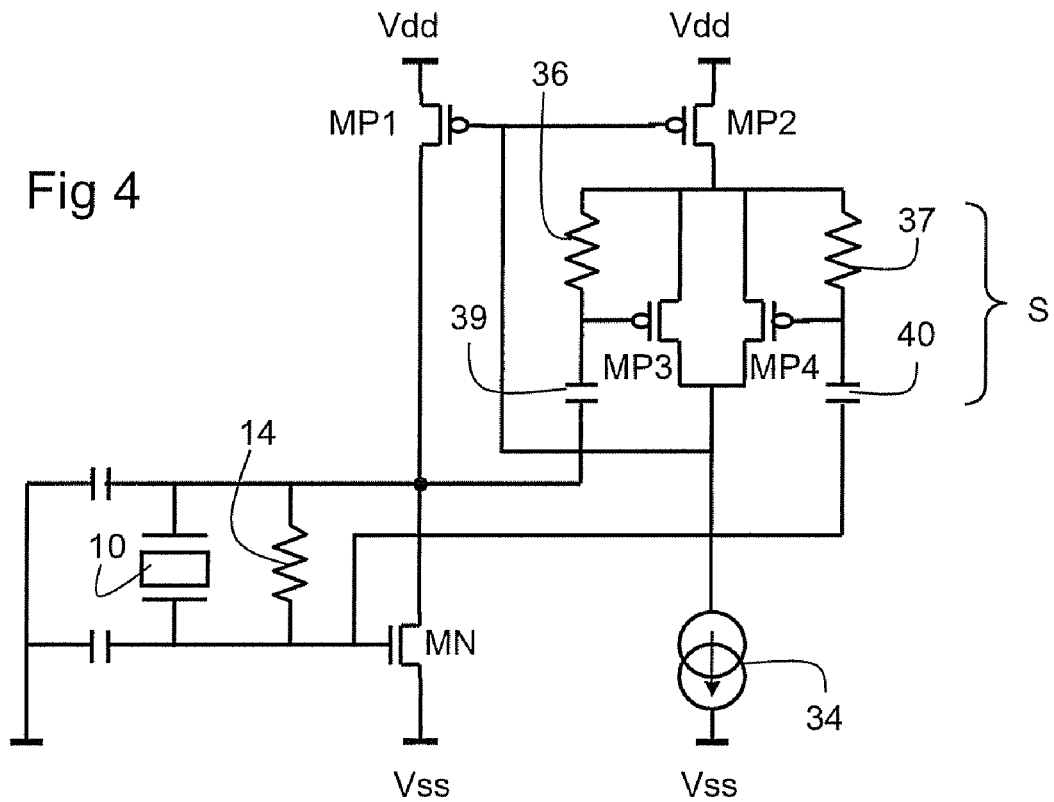
FIG. 4 represents a detailed example of the embodiment of FIG. 3.

FIG. 4 represents an embodiment offering such a progressive switching. Switch S comprises two P-channel MOS transistors MP3 and MP4 connected in parallel by their drains and sources between transistor MP2 and current source 34. The gates of transistors MP3 and MP4 are connected to the drain of transistor MP2 by respective resistors 36 and 37. The gates of transistors MP3 and MP4 are further respectively connected to the terminals of resonator 10 by respective capacitors 39 and 40.

Capacitors 39, 40, associated with resistors 36, 37, form high-pass filters between the opposite phase oscillations present at the terminals of resonator 10 and the respective gates of transistors MP3 and MP4. In the absence of oscillations, in particular during the latency phase on start-up of the oscillator, capacitors 39, 40 have a constant charge and resistors 36 and 37 maintain a zero voltage between the gates and sources of transistors MP3 and MP4. This results in transistors MP3 and MP4 being turned-off, and therefore in switch S being open. The resonator is thus in a phase where it operates at maximum current.

Thanks to the high current, the resonator quickly reaches the end of the latency phase and starts to oscillate progressively. Capacitors 39, 40 transmit each oscillation half-wave to the gates of transistors MP3 and MP4. The gates of these transistors see half-waves oscillating around the source potential of the transistors, in phase opposition. Thus, whereas one of transistors MP3, MP4 is turned-off by a positive half-wave, the other transistor sees a negative half-wave which, if it exceeds the transistor threshold, turns the transistor on.

When the amplitude of the oscillations is sufficient, transistors MP3 and MP4 are turned on in turn so that a permanent connection is established between the drain of transistor MP2 and current source 34. Switch S is then closed and ensures operation at minimum current. This operation at minimum current may be reached well before the oscillator reaches its steady state, as the amplitude of the oscillations exceeds the threshold of transistors MP3 and MP4 by a sufficient amount.

Note that this embodiment may not require any particular care as to the sizing of the components, to ensure switching between a high current start-up state and a steady state of the oscillator. Variations of the threshold voltages of transistors MP3 and MP4 affect the oscillation amplitude above which these transistors start to switch, which shifts the time of switching to the low current mode within the start-up phase. The dimensional variations of transistors MP3 and MP4 also leave a great deal of latitude. Such variations affect the on-resistance of the transistors. This resistance, through which the current of source 34 flows, causes a parasitic voltage drop at the terminals of transistors MP3 and MP4 which tends to modify the biasing of transistor MP1 and therefore to modify the steady state current consumption. However, since the current of source 34 is chosen particularly low (it is multiplied by the surface ratio of transistors MP1 and MP2), this parasitic voltage drop remains negligible, even for the minimum size of transistors MP3 and MP4.

The values of resistors 36, 37 and capacitors 39, 40 have little influence on the switching characteristics. They have a certain influence on the current consumption and the circuit size, so it will be preferable to choose them to obtain a good trade-off, but it is not overly helpful to take their variability into account.

The oscillator embodiments described here do not directly target the issue of oscillation clipping and amplitude control. This issue is addressed inherently by the fact that the steady-state current will be chosen as low as possible. Since the amplitude of the oscillations tends to vary in the same direction as this current, it is naturally under control.

A maximum of three transistors are connected in series between the power supply lines, which enables the oscillator to be powered under low voltages.

Various alternatives and modifications of the embodiments described here will appear to those skilled in the art. For example, N-channel transistors can be replaced by P-channel transistors and P-channel transistors be replaced by N-channel transistors in FIG. 4.

That which is claimed:

1. An oscillator comprising:
   an inverter having an input and an output and comprising an inverter transistor having a gate terminal;
   a resonator coupled between the input and the output of said inverter;
   an external transistor coupled in a current mirror mode with said inverter transistor such that said inverter transistor copies a current in said external transistor, said external transistor having a drain terminal coupled to the gate terminal of said inverter transistor, and a gate terminal coupled to the drain terminal;
   a current source coupled to the gate terminal of said inverter transistor; and
   a switch coupled between the drain terminal of said external transistor, and a node between the gate terminal of said inverter transistor and said current source to interrupt current in said external transistor.

2. An oscillator according to claim 1, wherein said switch comprises first and second transistors each having a gate terminal, said first and second transistors coupled in parallel.

3. An oscillator according to claim 2, further comprising first and second high pass filters to couple the gate terminals of said first and second transistors to the input and output of said inverter, respectively.

4. An oscillator comprising:
   an inverter comprising an inverter transistor;
   a resonator coupled to said inverter;
   an external transistor coupled in a current mirror mode with said inverter transistor;
   a current source coupled to said inverter transistor;
   a switch configured to interrupt current in said external transistor; and
   first and second high pass filters to connect said switch to said inverter.

5. An oscillator according to claim 4, wherein said switch comprises first and second transistors coupled in parallel.

6. An oscillator according to claim 5, wherein said first and second high pass filters to connect said first and second transistors to said inverter.

7. A method of starting a crystal resonator oscillator comprising:
   starting the crystal resonator oscillator by supplying it with a start-up current;
   waiting for an end of a latency phase without oscillations of the crystal resonator oscillator; and
   supplying the crystal resonator oscillator with a lower current than the start-up current for a time between an end of the latency phase and establishment of a steady state.

8. A method of making an oscillator comprising:
   coupling a resonator between an input and an output of an inverter, the inverter comprising an inverter transistor;
   coupling an external transistor in a current mirror mode with the inverter transistor such that the inverter transistor copies a current in the external transistor, the external transistor having a drain terminal coupled to a gate terminal of the inverter transistor, and a gate terminal coupled to the drain terminal;
   coupling a current source to the gate terminal of the inverter transistor;
   coupling a switch between the drain and the gate terminals of the external transistor; and
   configuring the switch to interrupt current in the external transistor, with the switch being coupled between the drain terminal of the external transistor, and a node between the gate terminal of the inverter transistor and the current source.

9. A method according to claim 8, wherein the switch comprises first and second transistors each having a gate terminal, the first and second transistors coupled in parallel.

10. A method according to claim 9, further comprising coupling the gates of the first and second transistors to the input and the output of the inverter, respectively, via first and second high pass filters.

11. A method of making an oscillator comprising:
    coupling a resonator to an inverter comprising an inverter transistor;
    coupling an external transistor in a current mirror mode with the inverter transistor;
    coupling a current source coupled to the inverter transistor;
    coupling a switch to the external transistor; and
    configuring the switch to interrupt current in the external transistor; and
    coupling first and second high pass filters to connect the switch to the inverter.

12. A method according to claim 10, wherein the switch comprises first and second transistors coupled in parallel.

13. A method according to claim 12, wherein the first and second high pass filters couple the first and second transistors to the inverter.

* * * * *